United States Patent [19]

Shirai et al.

[11] Patent Number: 5,296,745
[45] Date of Patent: Mar. 22, 1994

[54] SEMICONDUCTOR DEVICE HAVING A MOISTURE BARRIER AROUND PERIPHERY OF DEVICE

[75] Inventors: Kenichi Shirai, Yokohama; Satoshi Shibahara, Tokyo, both of Japan

[73] Assignee: Kabushiki Kaisha Toshiba, Kawasaki, Japan

[21] Appl. No.: 674,753

[22] Filed: Mar. 25, 1991

[30] Foreign Application Priority Data

Mar. 23, 1990 [JP] Japan .................................. 2-72134
Feb. 18, 1991 [JP] Japan .................................. 3-078685

[51] Int. Cl.$^5$ ...................... H01L 29/34; H01L 27/02
[52] U.S. Cl. ...................................... 257/786; 257/618; 257/751
[58] Field of Search ........................ 357/41, 55, 52; 257/618, 780, 781, 751, 784, 786

[56] References Cited

U.S. PATENT DOCUMENTS

| | | | |
|---|---|---|---|
| 3,745,428 | 7/1973 | Misawa et al. | 357/54 |
| 4,001,872 | 1/1977 | Khajezadeh | 357/54 |
| 4,841,354 | 5/1989 | Inaba | 357/71 |
| 4,916,509 | 4/1990 | Blanchard et al. | 357/65 |
| 4,984,039 | 1/1991 | Douglas | 357/41 |
| 4,985,740 | 1/1991 | Shenai et al. | 357/41 |
| 5,016,071 | 5/1991 | Kumagai et al. | 357/55 |
| 5,017,999 | 5/1991 | Roisen et al. | 357/55 |
| 5,027,173 | 6/1991 | Satoh | 357/55 |

FOREIGN PATENT DOCUMENTS 59-043557 3/1984 Japan .
62-181436 8/1987 Japan .
2-181925 7/1990 Japan .

*Primary Examiner*—Andrew J. James
*Assistant Examiner*—D. Monin
*Attorney, Agent, or Firm*—Foley & Lardner

[57] ABSTRACT

A semiconductor device having a moisture barrier comprises a semiconductor substrate, a plurality of bonding pads arranged along at least one side of the semiconductor substrate, and an insulating film provided between at least one side of the semiconductor substrate and the bonding pads opposite to that side, and provided with means for preventing incursion of moisture, thereby to prevent moisture from being absorbed from the chip side surface. Further, there is also disclosed a method of manufacturing such a semiconductor device, which comprises the steps of forming an insulating film on a semiconductor wafer, forming a plurality of bonding pads arranged along dicing lines of the semiconductor wafer, and forming a contact hole or a via hole in the insulating film, and forming at the same time, a groove structure so that it is arranged between the dicing lines and the plurality of bonding pads.

8 Claims, 12 Drawing Sheets

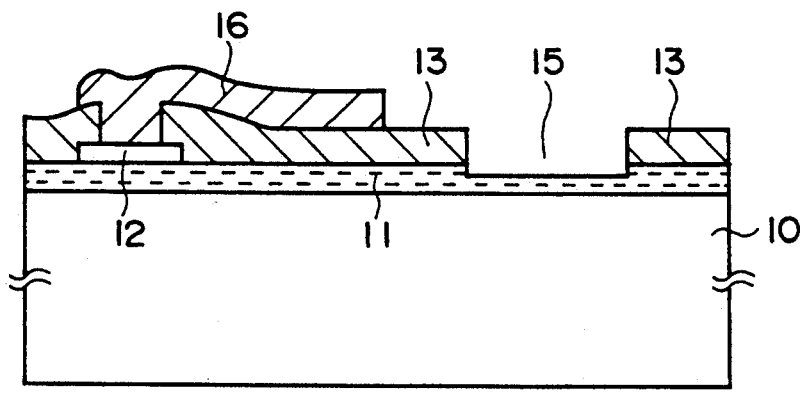
F I G. 3C
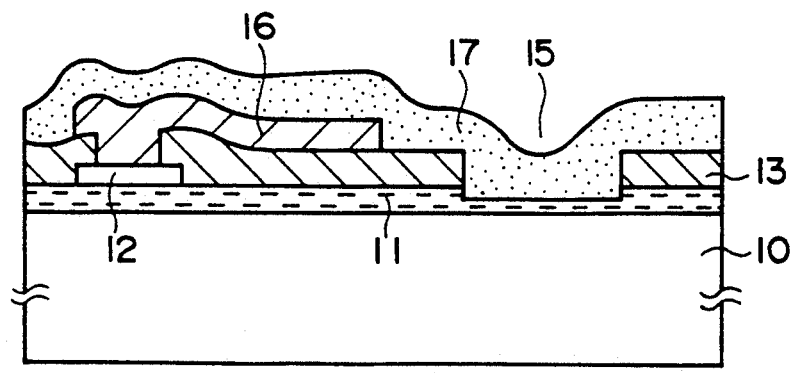
F I G. 3D

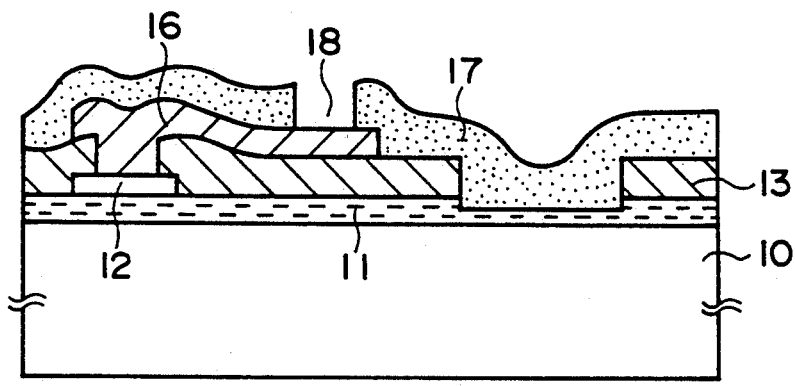
F I G. 3E
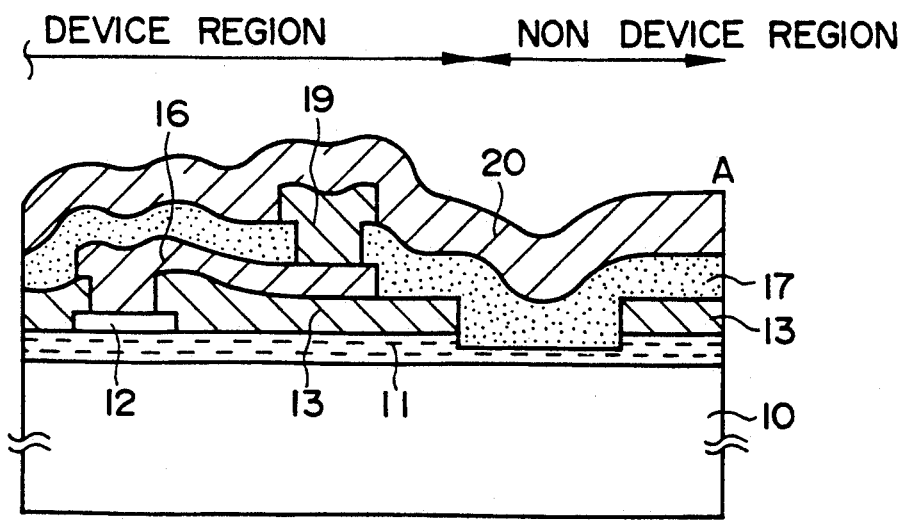
F I G. 3F

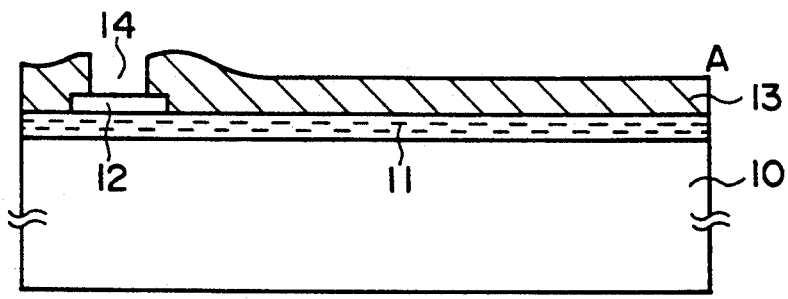
F I G . 4A
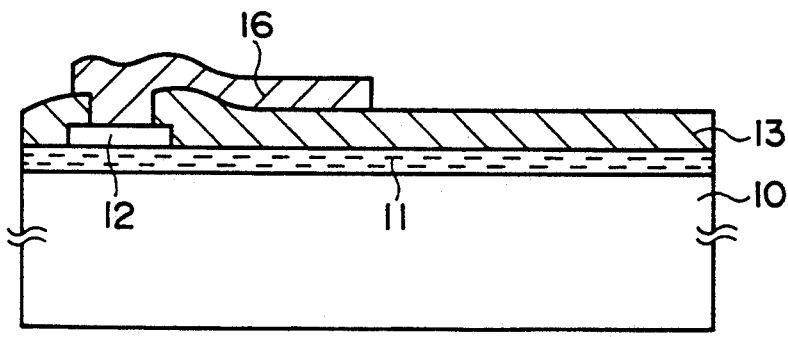
F I G . 4B
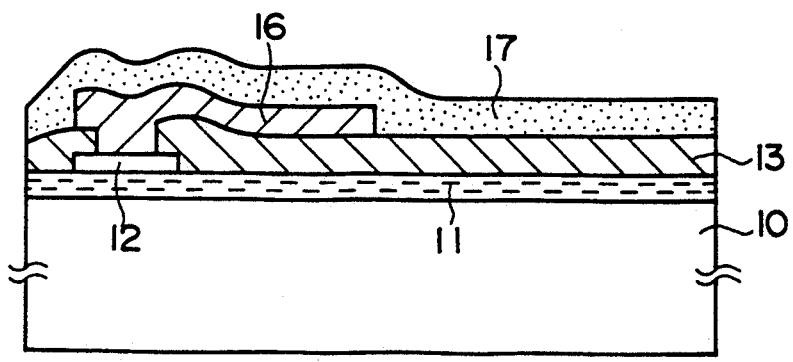
F I G . 4C

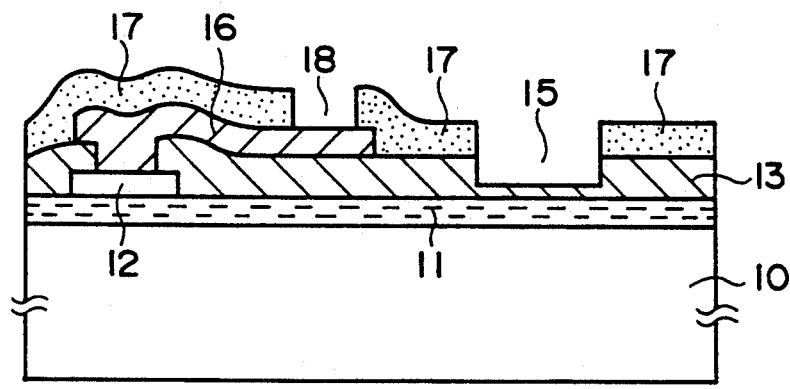
F I G. 4D
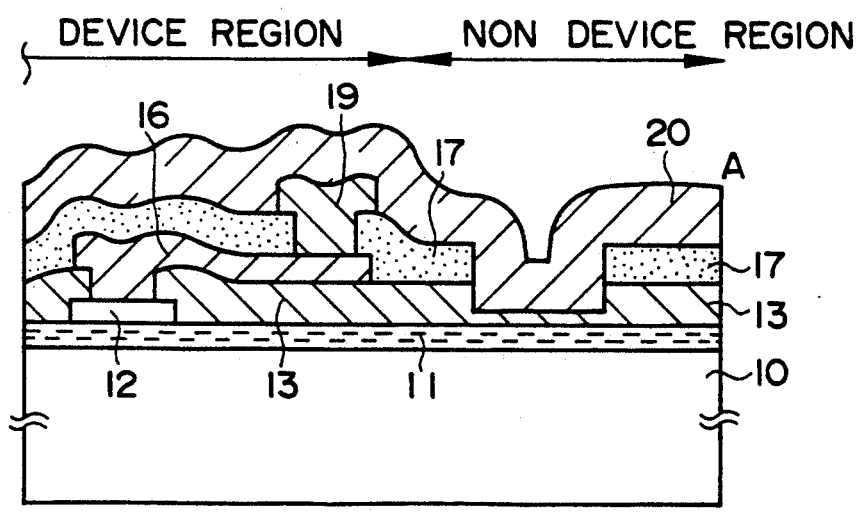
F I G. 4E

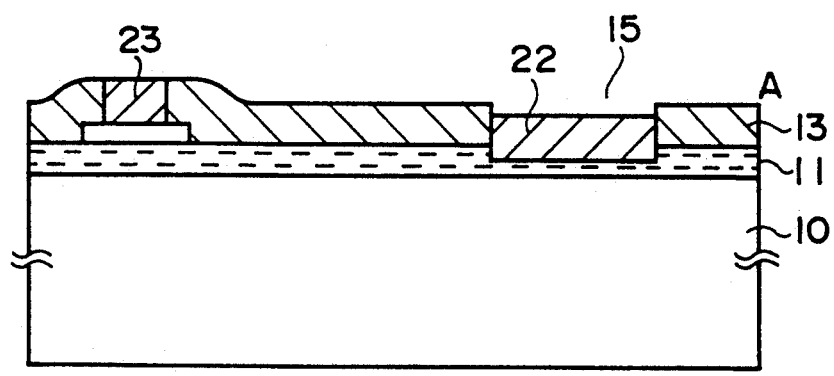
F I G. 7A
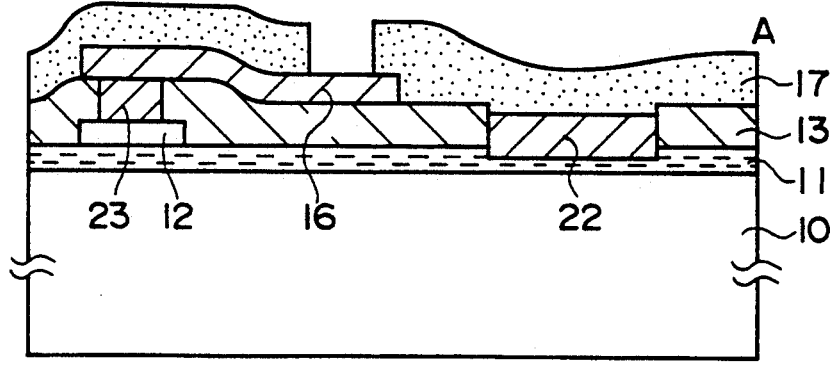
F I G. 7B
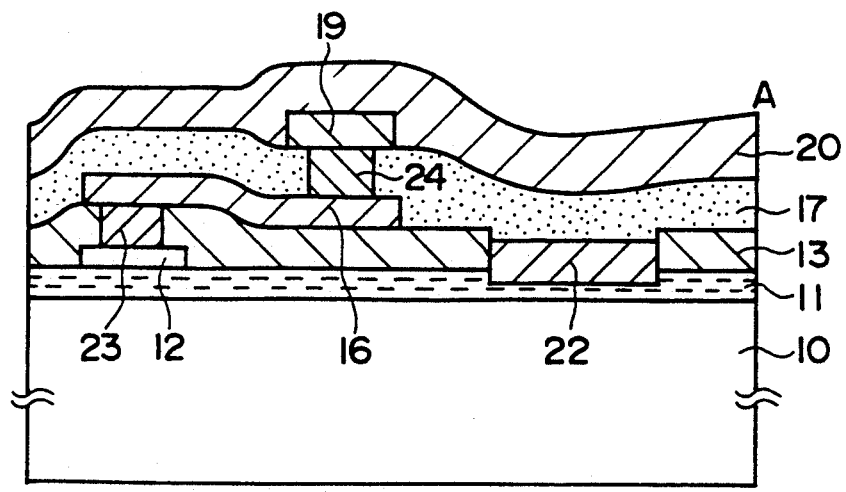
F I G. 7C

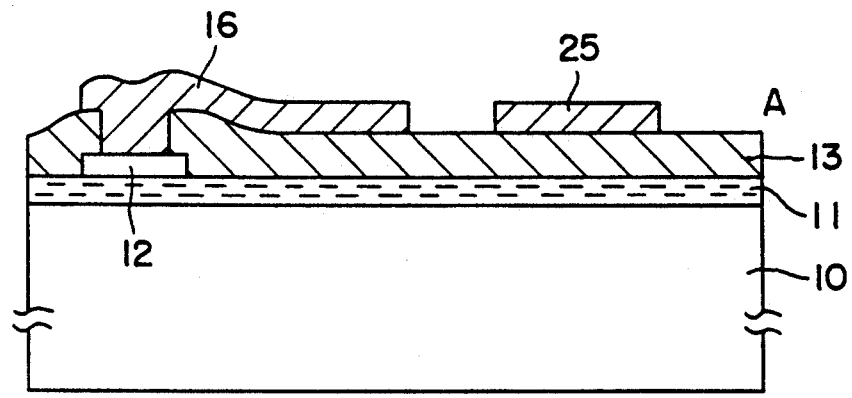
F I G. 14 A
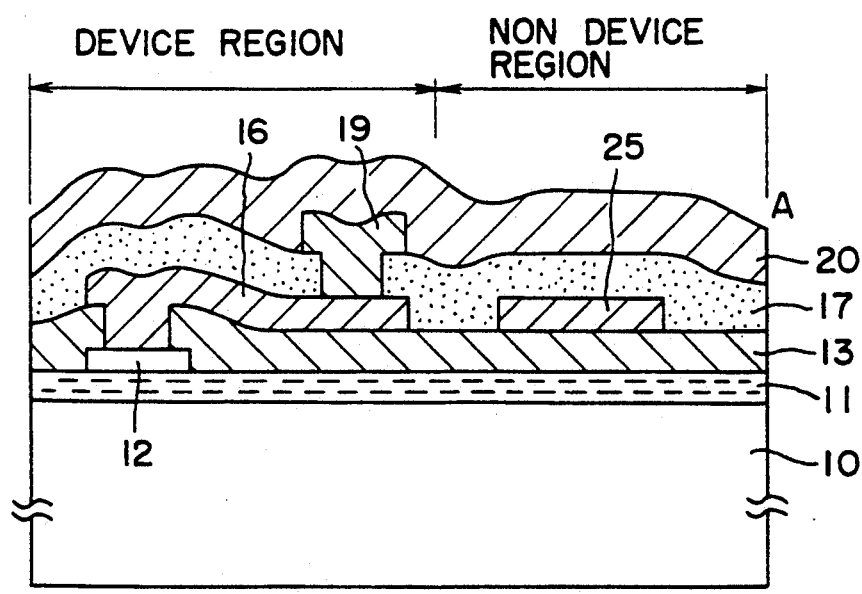
F I G. 14 B

SEMICONDUCTOR DEVICE HAVING A MOISTURE BARRIER AROUND PERIPHERY OF DEVICE

BACKGROUND OF THE INVENTION

This invention relates to a semiconductor device and a method of manufacturing the same, and more particularly to a technology to improve moisture resistance of a semiconductor device.

In semiconductor devices, aluminum wiring is frequently used at present. However, aluminum wiring is apt to become extremely corroded. Such wiring corrosion is simply called corrosion, and is a the very serious problem from a viewpoint of reliability of the semiconductor integrated circuit device. One of the causes of corrosion of aluminum wiring is moisture. By incursion of moisture, the moisture resistance of the semiconductor device is deteriorated. Particularly, in so called plastic packages molded by plastic resin, adhesion between the plastic resin and metal such as copper serving as a lead is poor. As a result, it is difficult to completely prevent moisture diffusion from the lead portion on the package side surface. Further, the plastic resin itself is somewhat has hygroscopic property.

For this reason, as a measure for improving moisture resistance of the semiconductor chip, passivation film (surface protective film) is conventionally used. For such a passivation film, a layered product comprised of a silicon nitride film ($Si_3N_4$), or $Si_3N_4$/PSG film, etc. is used. This passivation film can advantageously protect moisture incursion from the upper direction of the semiconductor chip. Meanwhile, in the process for manufacturing semiconductor devices, after a passivation film is formed on the entire surface of the wafer, the wafer is subjected to dicing. Thus, chips are quarried. In this case, however, since the side surface of the chip having a cutting plane is not covered by the passivation film, incursion of moisture from the chip side surface constitutes a great problem. Namely, moisture comes into contact with BPSG film or PSG used as an insulating film to produce phosphoric acid. This phosphoric acid corrodes aluminum wiring, etc.

As stated above, the conventional semiconductor devices have the problem that aluminum wirings and/or elements in the chip would be corroded by incursion of moisture from the side surface where there is a cutting plane of a semiconductor chip formed by dicing a semiconductor wafer, disadvantageously resulting in an unsatisfactory operation.

SUMMARY OF THE INVENTION

With the above-mentioned problems with the conventional semiconductor device in view, an object of this invention is to prevent the intrusion of moisture from the semiconductor chip side surface, thus to improve the moisture resistance of the semiconductor device.

In accordance with the first aspect, there is provided a semiconductor device comprising a semiconductor substrate, a plurality of bonding pads arranged along at least one side of the semiconductor substrate, and an insulating film provided between at least one side of the semiconductor substrate and said bonding pads opposite to the one side, and comprised of at least two layers provided with means for preventing incursion of moisture.

In accordance with the second aspect, there is provided a method of manufacturing a semiconductor device comprising the steps of: forming an insulating film on a semiconductor wafer, forming a plurality of bonding pads arranged along dicing lines of the semiconductor wafer, and forming a contact hole or a Via hole in the insulating film, and forming a groove structure at the same time so that the groove structure is arranged between the dicing lines and the plurality of bonding pads.

In the semiconductor device of this invention, means for preventing intrusion of moisture, such as, for example, a groove structure or a metal film, etc. are formed between bonding pads and sides of the chip, i.e., at the entire or partial portion of the outer periphery of the chip. As a result, the connecting portion of two films of poor adhesion is cut off at that portion. For this reason, there is no possibility that moisture from the chip side surface is intruded into the device region in the chip. Further, since these means are formed in correspondence with the process for forming a contact hole, or a via hole, etc. in the insulating film, they can be realized without particularly increasing the process steps.

For better understanding of this invention, the problems with the prior art will now be described in detail with reference to the attached drawings.

FIG. 1 is a cross sectional view showing a semiconductor chip end of a semiconductor device according to the prior art by dicing a semiconductor wafer; FIG. 2 is a plan view showing a semiconductor device according to other prior art. The semiconductor chip is divided into the device region where elements at the central portions, e.g., wirings and bonding pads, are ordinarily formed, and the non-device region existing around the semiconductor chip. As shown in FIG. 1, in the case of a semiconductor device according to the prior art, intrusion of moisture from the upper direction of the chip can be prevented by a $Si_3N_4$ film 20 serving as a surface protective film. In this case, however, on the chip side surface subjected to dicing along the dicing lines of the semiconductor wafer, a field oxide film 11, a BPSG (phoso-silicate glass including borom) film 13 and a $SiO_2$ film 17, etc. located below the $Si_3N_4$ film 20 are exposed on a semiconductor substrate 10. On the semiconductor substrate 10, a polysilicon electrode 12, an aluminum wiring 16 of the first layer connected to the polysilicon electrode, and an aluminum wiring 19 of the second layer are formed.

In the semiconductor device shown in FIG. 2, a region 53 where a plurality of elements such as transistors and capacitors, etc., and wirings 57 are formed (hereinafter called a functional region). Along respective sides of the semiconductor chip, bonding pads 52 connected externally are formed, and these wirings 57 electrically connect the bonding pads 52 and the internal circuit. Accordingly, the device region of the semiconductor device indicates the portion including the functional region, wirings and bonding pads. However, as understood from this figure, the portion 531 of the functional regional 53 is close to the side 54 serving as the chip end portion. Namely, the width of the non-device region is narrow. For this reason, moisture is intruded from the chip side surface. As a result, aluminum wirings and/or elements are corroded, so unsatisfactory operation is apt to take place. This is confirmed by the moisture resistance test, etc. Meanwhile, the intrusion path of moisture is the interfacial portion between films. It has been known that moisture is apt to be intruded between films of poor adhesion, e.g., a BPSG film (phoso-silicate glass film including boron) and a PCVD $SiO_2$ ($SiO_2$ formed by the plasma CVD process). This PCVD $SiO_2$ film has an unsatisfactory relationship with other films including PSG film.

BRIEF DESCRIPTION OF THE DRAWINGS

In the accompanying drawings;

FIGS. 3A to 3F are cross sectional views showing successive process steps for manufacturing a semiconductor device of a first embodiment according to this invention, respectively;

FIGS. 4A to 4E are cross sectional views showing successive process steps for manufacturing a semiconductor device of a second embodiment according to this invention, respectively;

FIGS. 7A to 7C are cross sectional views showing successive process steps of a fifth embodiment according to this invention;

FIGS. 14A and 14B are cross sectional views showing an eighth embodiment according to this invention.

DESCRIPTION OF THE PREFERRED EMBODIMENTS

Preferred embodiments of this invention implemented in order to solve the above-mentioned problems will now be described.

Figure 1:
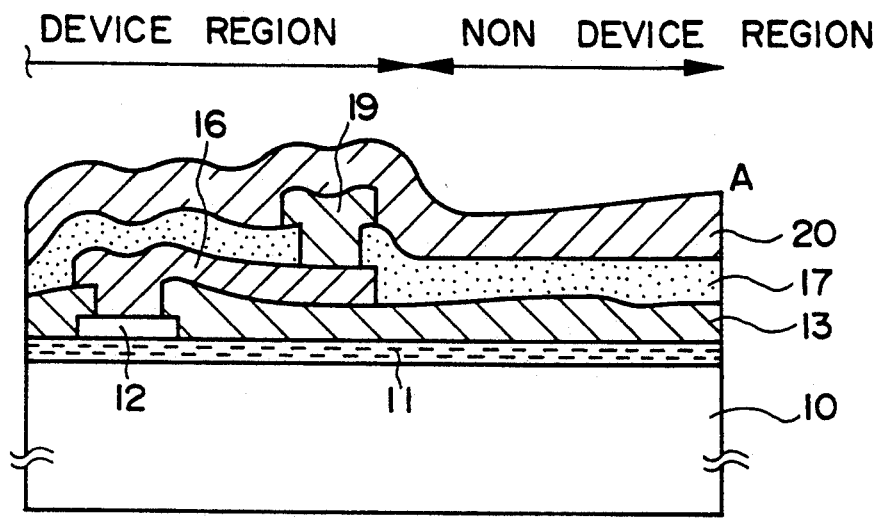
FIG. 1 is a cross sectional view showing a semiconductor device according to a prior art.
Figure 2:
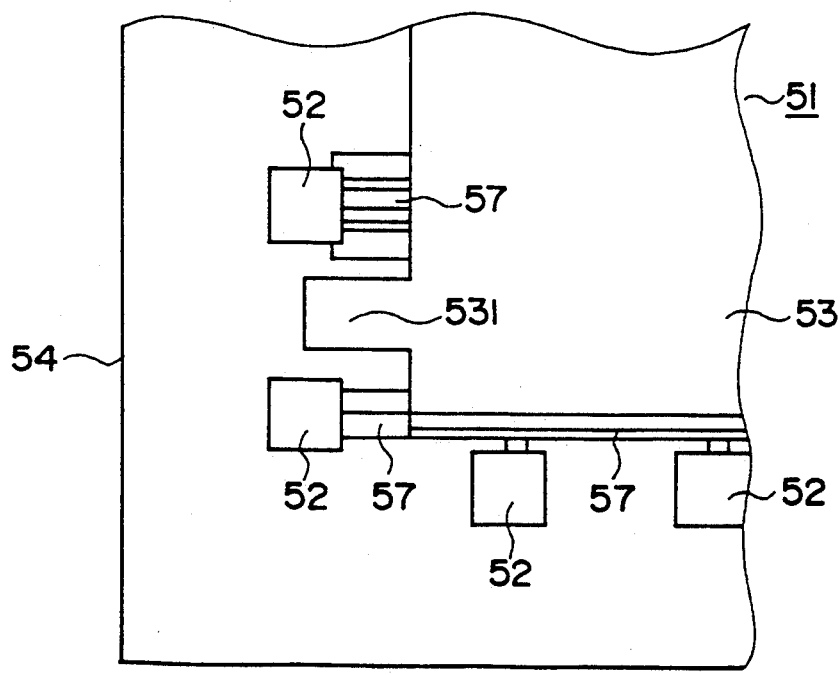
FIG. 2 is a plan view showing a semiconductor device according to another prior art.
Figure 3A:
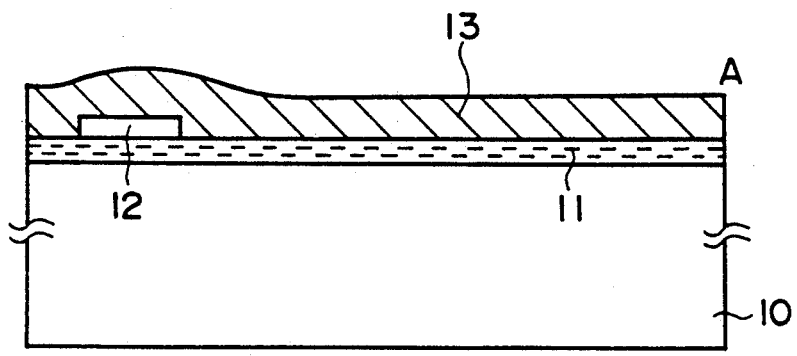

A first embodiment of this invention will be first described with reference to FIG. 3. FIG. 3A shows a cross section of a portion of the semiconductor ship. A field oxide film 11 and a polysilicon electrode layer 12 are formed on a silicon semiconductor substrate 10. A $SiO_2$ film is formed thereon by low pressure CVD (Chemical Vapor Deposition) process at a temperature of about 400° C. Further, a BPSG film is formed thereon to thereby form a BPSG/CVD $SiO_2$ film 13 of the two-layer structure serving as an insulating film. The side surface A on the right hand shows one side of the semiconductor chip provided by cutting or quarrying a silicon wafer along a dicing line.

Figure 3B:
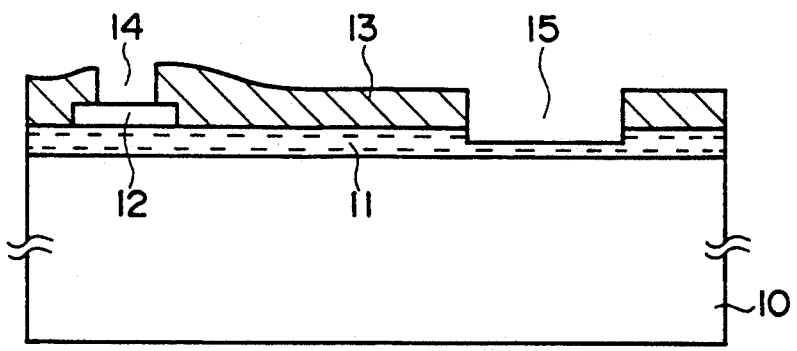

As shown in FIG. 3B, by etching the BPSG/CVD $SiO_2$ film 13 by making use of a resist film exposed using a photomask (not shown), a contact hole 14 and a groove structure 15 are formed at the same time. At this time, the groove structure 15 is formed so as to reach the field oxide film 11. The width of the groove structure is 10 $\mu m$, and the depth thereof is about 1 $\mu m$. In this figure, a portion of the field oxide film 11 is etched.

In this case, if the adhesion between the BPSG/CVD $SiO_2$ film 13 and the $SiO_2$ film formed thereon is poor, it is sufficient that at least BPSG/CVD $SiO_2$ film 13 is completely etched. Further, if the adhesion between the BPSG film of the BPSG/CVD $SiO_2$ film 13 and the $SiO_2$ film formed thereon is poor, it is sufficient that at least the BPSG film is completely etched. Namely, if there is employed an approach such that two films of poor adhesion are not connected, satisfactory effects or advantages are provided.

As shown in FIG. 3C, aluminum is then vacuum-deposited by sputtering to apply patterning thereto so as to take a desired form by making use of a photomask (not shown) to thereby form an aluminum wiring 16 of the first layer. Then, as shown in FIG. 3D, a PCVD $SiO_2$ film 17 serving as an interlayer insulating film is deposited on the aluminum wiring 16 of the first layer, on the field oxide film 11, and on the BPSG/CVD $SiO_2$ film 13 by the plasma CVD process at about 300° C. Then, as shown in FIG. 3E, a via hole 18 is formed by the reactive ion etching process by making use of a photomask (not shown). Subsequently, as shown in FIG. 3F, aluminum is vacuum-deposited by sputtering to apply patterning thereto to form an aluminum wiring 19 of the second layer. Finally, a $Si_3N_4$ film 20 serving as a surface protective film is deposited by the low pressure CVD process at a temperature of about 400° C. As shown, the groove structure 15 is arranged in the non-device region from the side surface A of the semiconductor chip to the portion where bonding pads (not shown) positioned internally therefrom are formed.

A second embodiment of this invention will now be described with reference to FIGS. 4A to 4E. As shown in FIG. 4A, a $SiO_2$ film is formed, by the CVD process, on a field oxide film 11 and a polysilicon electrode 12 formed on a silicon semiconductor substrate 10. Further, a BPSG film is formed thereon to form a BPSG/CVD $SiO_2$ film 13 serving as an insulating film of the two-layer structure. The end surface A on the right hand indicates one side of a semiconductor chip of this embodiment. Then, by etching the BPSG/CVD $SiO_2$ film 13 by making use of a photomask (not shown), a contact hole 14 is formed. At this stage, the groove structure is not yet formed. Then, as shown in FIG. 4B, aluminum is vacuum-deposited by sputtering to apply patterning thereto so as to take a desired form, thus to form an aluminum wiring 16 of the first layer. Then, as shown in FIG. 4C, a PCVD $SiO_2$ film 17 serving as an interlayer insulating film is deposited by the plasma CVD process. Then, as shown in FIG. 4D, a via hole 18 and a groove structure 15 are formed by reactive ion etching at the same time by making use of a photomask (not shown). The width of the groove structure is approximately 12 $\mu m$ and the depth thereof is approximately 1.7 $\mu m$. Further, aluminum is vacuum-deposited to apply patterning thereto to form an aluminum wiring 19 of the second layer. Finally, a $Si_3N_4$ film 20 serving as a surface protective film is formed by the decompressed CVD process. A semiconductor device of a structure as shown in FIG. 4E is formed. As shown in this figure, the groove structure 15 is formed in the non-device region from one side (right side surface A) of the semiconductor chip to bonding pads (not shown) therein.

Figure 5:
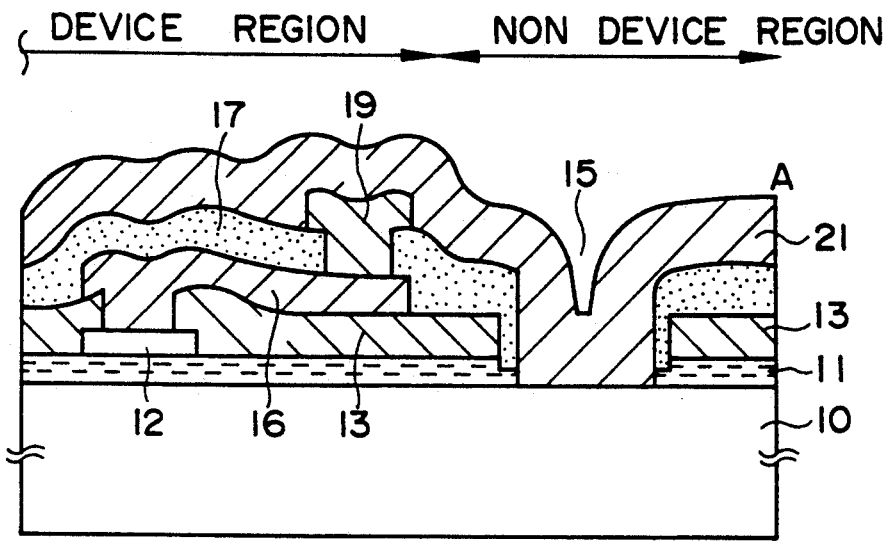
FIG. 5 is a cross sectional view showing a third embodiment according to this invention.

A third embodiment for forming a groove structure by making use of both the process for forming the contact hole and the process for forming the via hole will now be described with reference to FIG. 5. In FIG.

5, a field oxide film 11 is formed on a semiconductor substrate 10, and a polysilicon electrode 12 and a BPSG/CVD SiO$_2$ film 13 of the two-layer structure are formed thereon. On the polysilicon electrode 12 and the BPSG/CVD SiO$_2$ film 13 of the two-layer structure, an aluminum wiring 16 of the first layer and a PCVD SiO$_2$ film 17 are formed in order recited by the plasma CVD process. A via hole is provided in the PCVD SiO$_2$ film 17. By this via hole, contact between the aluminum wiring of the second layer and the aluminum wiring 16 of the first layer is provided. Since the groove structure 15 is formed by making use of both the contact hole formation process and the via hole formation process, the Si$_3$N$_4$/PSG film 21 serving as a surface protective film reaches the semiconductor substrate 10. It is to be noted that the surface of the semiconductor substrate 10 is completely covered with this Si$_3$N$_4$/PSG film 21. The depth of the groove structure 15 at this time is approximately 2.4 $\mu$m. The right side surface A indicates one side of the semiconductor chip of this embodiment. This groove structure 15 is formed in the non-device region from that side to bonding pads (not shown) provided therein. In this example, at the time of forming a groove structure in the via hole formation process, the substrate is exposed. However, since there is the possibility that pollution impurities may be absorbed into the substrate, it is preferable to allow the field oxide film to be left to a small extent without completely removing it by etching. Further, the groove structure at two processes may be arranged at different positions, respectively.

While the groove structure may be formed at any process step as previously described, an approach may be employed to etch at least one of two films of poor adhesion whereby the contact surface of two films of poor adhesion is cut off, whereas two films of good adhesion are connected. Thus, effective advantages are provided.

Figure 6:
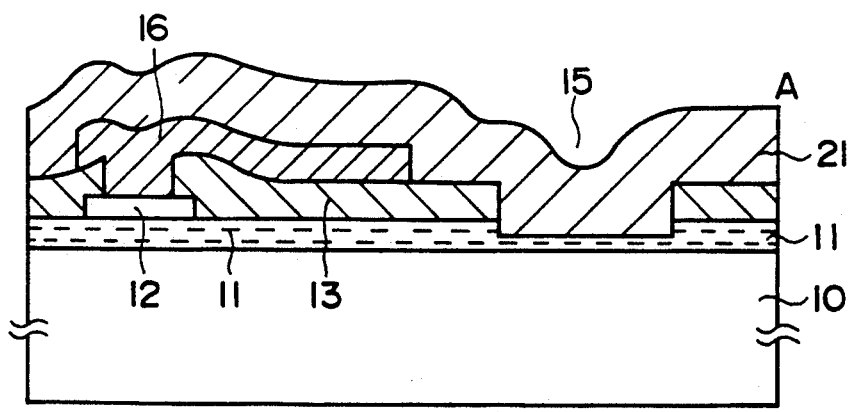
FIG. 6 is a cross sectional view showing a fourth embodiment according to this invention.

A fourth embodiment in the case where the aluminum wiring is of a single layer structure will now be described with reference to FIG. 6. In FIG. 6, a polysilicon electrode 12 and a BPSG/CVD SiO$_2$ film 13 of the two-layer structure are formed on a field oxide film 11 formed on a silicon semiconductor substrate 10. Further, on the polysilicon electrode 12 and the BPSG/CVD SiO$_2$ film 13 of the two-layer structure, an aluminum wiring 16 and a Si$_3$N$_4$ film 21 serving as a surface protective film are formed in a stacked manner in order recited. The right side surface A indicates one side of the semiconductor chip of this embodiment. A groove structure 15 is arranged in the non-device region from that side to the region where bonding pads in the chip are formed. It is further noted that this invention provides the advantages also in semiconductor devices having an aluminum wiring of three layers or more.

A fifth embodiment will now be described with reference to FIGS. 7A to 7C. First, a SiO$_2$ film is formed by the low-pressure CVD process at a temperature of about 400° C. on a field oxide film 11 and a polysilicon electrode 12 formed on a silicon semiconductor substrate 10. Further, a BPSG film is formed thereon to thereby form a BPSG/CVD SiO$_2$ film 13 of two-layer structure serving as an interlayer insulating film. Then, the BPSG/CVD SiO$_2$ film 13 is etched by making use of a photomask (not shown) to form a contact hole 14 and a groove structure 15 at the same time. The groove structure 15 is formed so as to reach the field oxide film 11. The width of the groove structure is about 10 $\mu$m.

While a portion of the field oxide film 11 is also etched in the case of this figure, in the case where adhesion between the BPSG/CVD SiO$_2$ film and the SiO$_2$ film formed thereon is poor, it is sufficient that at least the BPSG/CVD SiO$_2$ film is completely etched so that two films of poor adhesion are not connected at the groove structure portion. Then, tungsten 23 is filled into the contact hole 14 by the buried CVD process, and the same tungsten 22 is buried also into the groove structure 15 at the same time (FIG. 7A). Thereafter, aluminum is vacuum-deposited on the contact hole 14 and the BPSG/CVD SiO$_2$ film 13 by sputtering to apply patterning thereto so as to take a desired form by making use of a photomask to form an aluminum wiring 16 of the first layer.

This wiring 16 is electrically connected to the polysilicon electrode 12 through the tungsten 22 in the contact hole 14. Thereafter, a PCVD SiO$_2$ film 17 serving as an interlayer insulating film is deposited by the plasma CVD process at a temperature of about 300° C. on the BPSG/CVD SiO$_2$ film 13 and the tungsten 22 in the groove structure 15 including the wiring 16. This insulating film 17 is subjected to reactive etching by making use of a photomask (FIG. 7B). In the same manner as at the preceding process step, tungsten 24 is buried into the via hole 18 by the buried CVD process. Then, aluminum is vacuum-deposited on the tungsten buried by sputtering and the insulating film 17 to apply patterning thereto so as to take a desired form by making use of a photomask to form an aluminum wiring 19 of the second layer. Finally, a Si$_3$N$_4$ film 20 serving as a surface protective layer is deposited by the low pressure CVD process at a temperature of about 400° C. (FIG. 7C). The right side surface A in this figure represents one side of the semiconductor chip of this embodiment quarried by dicing the semiconductor wafer. The groove structure 15 is formed in the non-device region between that side and bonding pads (not shown) provided inside that side. Moisture intrudes from the side surface A into the chip through the interface between the PCVD SiO$_2$ film and the BPSG/CVD SiO$_2$ film, but such an intrusion is prevented by the groove structure 15. As a result, corrosion of metal occurs only here, but corrosion of metal, etc. in the device region therein does not occur. Further, the presence of tungsten 22 within the groove structure 15 is advantageous to planarization of the PCVD SiO$_2$ film thereon.

Figure 8:
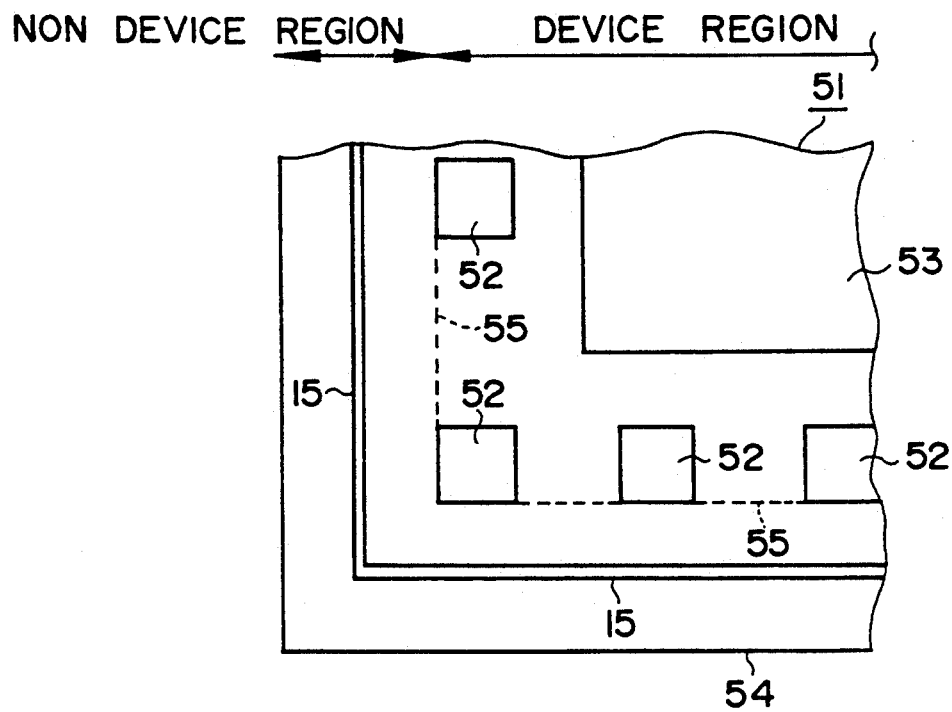
FIG. 8 is a schematic view showing a sixth embodiment according to this invention.
Figure 9:
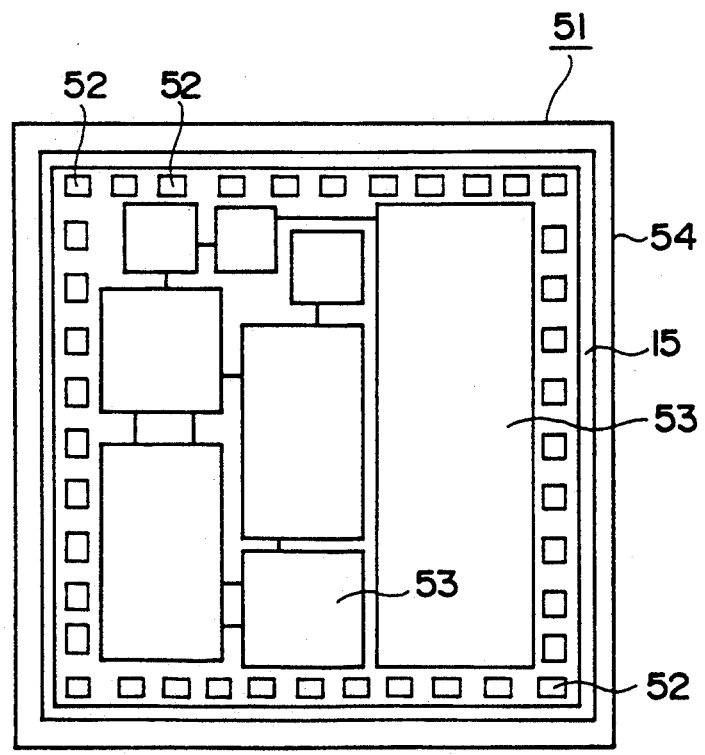
FIG. 9 is a plan view showing the entirety of the semiconductor chip 51 shown in FIG. 8.
Figure 10:
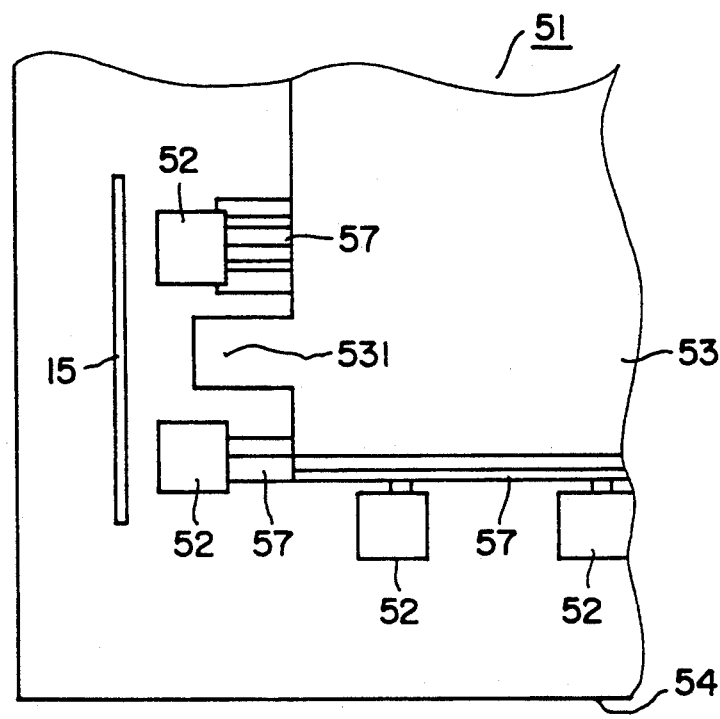
FIG. 10 is a plan view showing a modification of the groove structure.

A sixth embodiment directed to arrangement on the semiconductor chip of the groove structure of this invention will now be described with reference to FIGS. 8 to 10. In the case shown in FIG. 8, a plurality of bonding pads 52 and a functional region 53 where transistors, capacitors and the like are formed are formed on a semiconductor chip 51. The length of one side of the bonding pad is approximately 100 $\mu$m. The semiconductor chip 51 is quarried from this wafer by dicing of the semiconductor wafer on which a plurality of device regions are formed. A groove structure 15 is formed substantially in parallel with an arbitrary side in the non-device region between a line 55 connecting portions closest to an arbitrary side 54 of the semiconductor chip 51 of these respective bonding pads 52 and that side 54. FIG. 9 is a plan view showing the entirety of the semiconductor chip 51 shown in FIG. 8. In this example, the groove structure 15 is in the form of a continuous square frame. More particularly, that structure 15 is formed so as to completely encompass bonding pads 52 and respective functional regions on the semiconductor chip 51. In the example shown in FIG. 9, there are several separate functional regions. They are logic, memory, and CPU, etc. These components are systematically coupled to constitute a single semiconductor device. In this embodiment, the semiconductor device is a microcontroller. In the case of mounting the microcontroller on the semiconductor chip 51, there is no portion to which attention should be particularly drawn, but attention should be overall drawn to prevention of corrosion. Therefore, the groove structure 15 takes a form of square frame along respective sides of the semiconductor chip.

Figure 11:
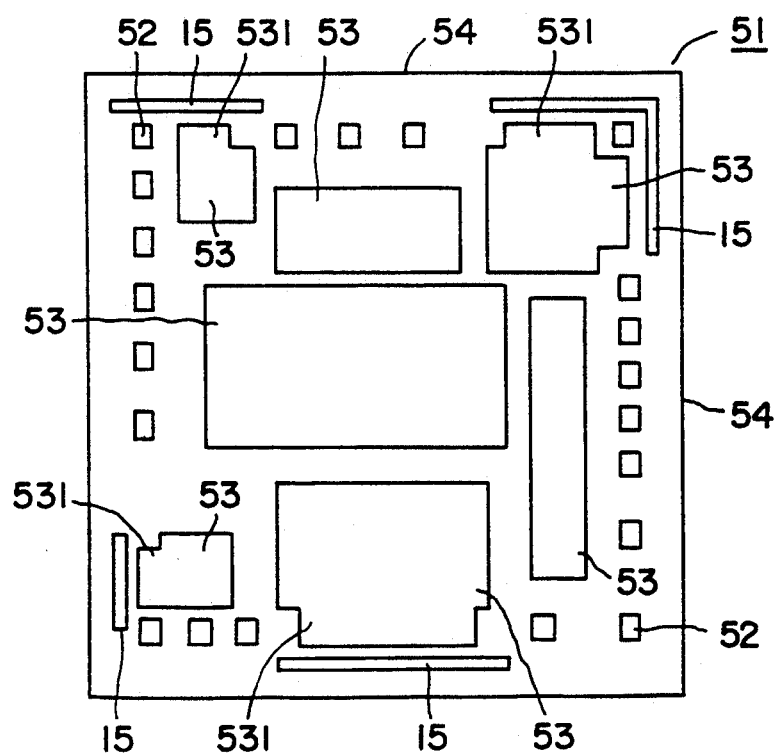
FIG. 11 is a plan view showing that a plurality of groove structures as shown in FIG. 10 are provided.

However, it is not limited that such a groove is a groove along the entire periphery of the chip as shown. For example, as shown in FIG. 10, in order to protect, from intrusion of moisture, a projected region 531 of functional region 53 particularly close to side 54 of semiconductor chip 51, a groove structure 15 may be provided only along the peripheral portion of the functional region 53. In the projected region 531, in the same manner as in other functional regions, elements such as transistor, capacitors, or the like, and wirings are formed. Since these elements and wirings are finer than the bonding pad 52, in the case where these components are projected to the portion in the vicinity of the region where bonding pads 52 are formed, it is required to form a groove structure as described above in the vicinity of the projected region even if there is no necessity of protecting bonding pads. The bonding pads and the functional regions are connected by means of wirings 57. While the groove structure 15 is locally provided in the example shown in FIG. 10, a plurality of such groove structures 15 are provided in the example shown in FIG. 11. Also in this example, groove structures 15 are provided at portions 531 where respective functional regions 53 are close to the sides 54 of the semiconductor chip 51. It is to be noted that the groove structure may be provided at the periphery of the region where the bonding pad is closer to the side of the chip, or at the periphery of the region where the wiring is closer to the side of the chip. Further, ordinary bonding pads are formed substantially equidistantly along the sides of the semiconductor chip. However, since there are instances where some custom products are arranged partially at a high integration, if groove structures as mentioned above are preponderantly arranged also at portions arranged at high integration, the advantage similar to the above can be sufficiently provided. Particularly, since protection against corrosion of the aluminum wiring of the first layer must be sufficiently carried out, it is required to draw more careful attention thereto as compared to protection of corrosion against metal such as other wirings.

Figure 12:
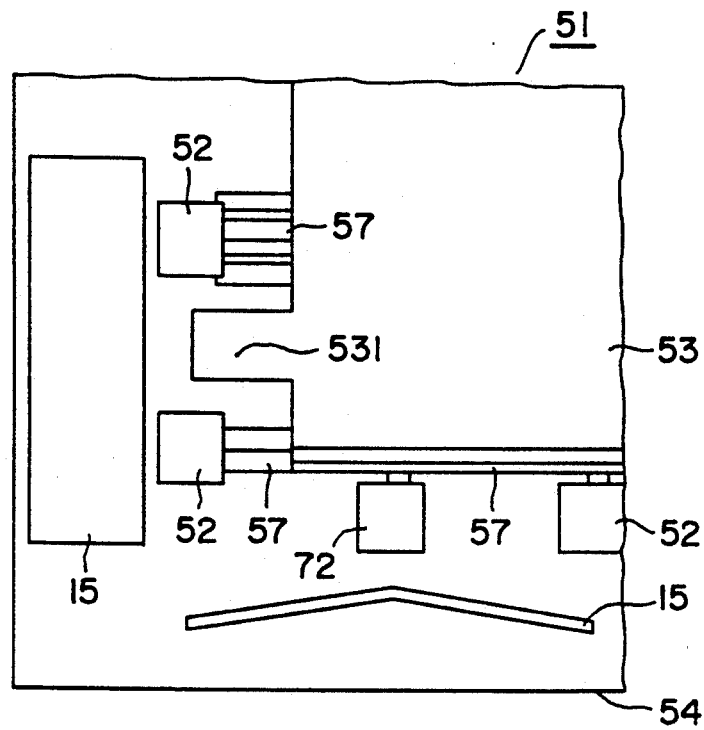
FIG. 12 is a plan view showing a modification of the groove structure shown in FIG. 10.

Further, as shown in FIG. 12, the groove structure 15 is not necessarily required to be completely in parallel with the side 54 of the semiconductor chip 51 as formed at the lower part of this figure. Further, in place of the groove structure in the form of slit, such a groove structure to extend to the full width of the non-device region may be employed. If there is a room therefor, the dimension of the groove structure may be further increased. From a practical point of view, if the upper limit is about 30 $\mu$m, and the lower limit is about 2 $\mu$m, sufficient advantages can be provided. It is of course that even if the dimensions of the groove structure exceed that range, the ability to prevent intrusion of moisture can be sufficiently exhibited.

Figure 13:
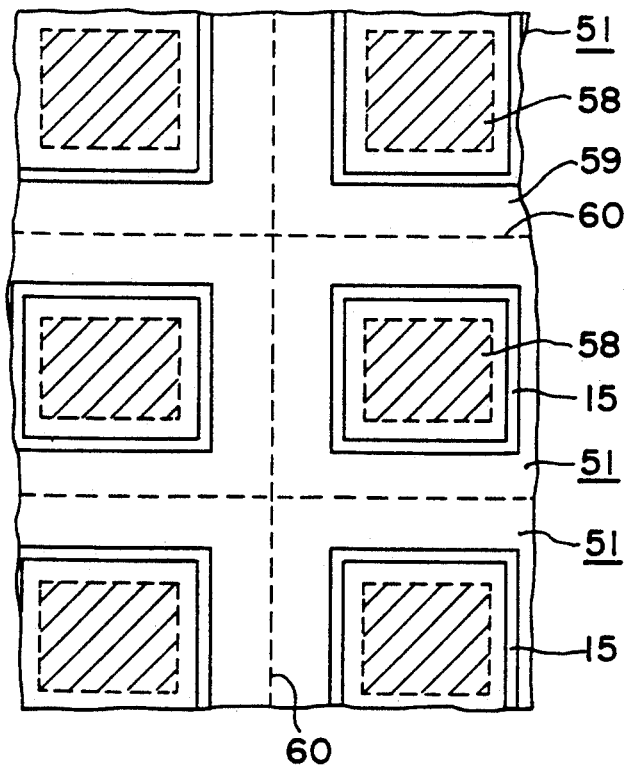
FIG. 13 is a plan view showing a seventh embodiment.

A seventh embodiment will now be described with reference to FIG. 13. This figure is a partial plan view of a semiconductor wafer before dicing. As shown in this figure, chips 51 formed along dicing lines 60 are comprised of device regions 58 and non-device regions 59 outside those regions 58. A groove region in the form of frame is formed in each non-device region 59. Since the semiconductor wafer is cut along the dicing lines 60 between respective groove structures, those groove structures 15 can be utilized as a dicing mark.

An eighth embodiment utilizing a metal film as the means for preventing intrusion of moisture will now be described with reference to FIGS. 14 and 14B. A BPSG/CVD SiO$_2$ film 13 serving as an interlayer insulating film is formed on a field oxide film 11 and a polysilicon electrode 12 formed on a silicon semiconductor substrate 10 thereafter to etch the insulating film 13, thus to form a contact hole 14 on the polysilicon electrode 12. This process step is the same as that shown in FIG. 4A. Then, aluminum is vacuum-deposited by sputtering on the insulating film 13 to apply patterning thereto so as to take a desired form by making use of a photomask (not shown) to form an aluminum wiring 16 of the first layer to connect it to the polysilicon electrode 12. At this time, an aluminum metal film 25 is formed annular on the insulating film 13 along the side of the semiconductor chip by making use of this patterning (FIG. 14A). The right side surface A in the figure represents that side. Then, a PCVD SiO$_2$ film 17 serving as an interlayer insulating film is formed to etch this film to form a via hole 18 on the aluminum wiring 16. Thereafter, an aluminum wiring 19 of the second layer is formed on the PCVD SiO$_2$ film 17 to connect it to the aluminum wiring of the first layer. Then, a Si$_3$N$_4$ film 20 serving as a surface protective layer is formed to coat the aluminum wiring 19 (FIG. 14B). As shown, the metal film 25 is formed in the non-device region between one side of the semiconductor chip and bonding pads (not shown) in the semiconductor substrate. Thus, moisture intruded from the semiconductor chip side surface A is prevented by the metal film 25. Thus, corrosion is conducted only here, resulting in no possibility that metal in the internal device region is corroded.

The result of the reliability test of this invention using a test chip is shown below. The PCT experiment of a chip having an area of 8.1 mm was conducted under the condition of RH of 100% and temperature of 127° C. As a result, chips according to the first to third embodiments were not all damaged until 160 hours. On the contrary, even 11 of 40 conventional chips provided with no means for preventing intrusion of moisture were broken before 160 hours.

While the silicon semiconductor has been mainly described in the embodiments of this invention, semiconductors used in the invention are not limited to such a silicon semiconductor. Namely, this invention can be all applied to existing materials, e.g., Ge, GaAs, or InP, etc. Further, as a matter of course, this invention can be applied to three-dimensional structure or SOS structure. While this invention can be applied to all semiconductor devices, this invention becomes more advantageous to semiconductor devices integrated to a higher degree, e.g., LSI and VLSI, etc. In addition, the microcontroller shown in FIG. 9 is only one example, and therefore this invention can be widely applied to memories such as RAM and ROM, etc., microprocessors, gate arrays, and the like.

As described above, in accordance with this invention, there is provided a groove structure formed in the non-device region along the outer peripheral portion in correspondence with the contact hole formation process step, etc., or a metal film of aluminum, etc. formed in correspondence with the aluminum wiring formation process step, etc. Accordingly, the connecting portion of two insulating films of poor adhesion is cut off, and two insulating films of good adhesion are connected at the portion of the groove structure. As a result, moisture incursion from the side surface of the semiconductor chip is prevented from being intruded into the chip. Thus, corrosion in the device region is sufficiently prevented.

What is claimed is:

1. A semiconductor device having a moisture barrier comprising:
   a semiconductor substrate,
   a plurality of bonding pads arranged along at least one side edge of said semiconductor substrate, and
   an insulating film provided between said side edge of said semiconductor substrate and the bonding pads provided along said side edge, and comprised of at least two layers; and
   means for preventing incursion of moisture, said preventing means being of a groove structure formed in said layers of said insulating film, said groove structure partially extending through said insulating film such that at least a portion of said insulating film remains between the bottom of said groove structure and said semiconductor substrate.

2. A semiconductor device having a moisture barrier as set forth in claim 1 wherein said groove structure has a width of 2 to 30 μm.

3. A semiconductor device having a moisture barrier as set forth in claim 1 wherein at least one metal selected from a group of W, Cu and Al is filled in said groove structure.

4. A semiconductor device having a moisture barrier as set forth in claim 1, wherein said groove structure is provided in parallel to respective side edges of said semiconductor substrate, said groove structure provided at neighboring sides of said substrate being connected to each other.

5. A semiconductor device having a moisture barrier as set forth in claim 1, wherein said groove structure is formed only in a region between a portion where the bonding pads are arranged at a density higher than that at other portions and the side edges of said semiconductor substrate.

6. A semiconductor device having a moisture barrier as set forth in claim 1, wherein said groove structure is provided between a portion where a functional region including elements formed at a central portion thereof and wirings is extending between neighboring bonding pads, and said side edge of said semiconductor substrate.

7. A semiconductor device having a moisture barrier as set forth in claim 1, wherein said insulating film includes at least two stacked layers of poor adhesion, said groove structure being formed so as to block the connecting portion of said two layers.

8. A semiconductor device comprising:
   a semiconductor substance containing a device region and a non-device region;
   a plurality of bonding pads arranged along at least one side edge of said semiconductor substrate in said device region;
   an insulating film provided on said semiconductor substrate; and
   means for preventing intrusion of moisture into said device region wherein said preventing means is provided between said bonding pads and said side edge of said semiconductor substrate and wherein said preventing means is a groove structure formed in said insulating film in said non-device region, said groove structure partially extending through said insulating film such that at least a portion of said insulating film remains between the bottom of said groove structure and said semiconductor substrate.

* * * * *